(12) United States Patent
Fukami

(10) Patent No.: US 7,936,627 B2
(45) Date of Patent: May 3, 2011

(54) MAGNETORESISTANCE EFFECT ELEMENT AND MRAM

(75) Inventor: Shunsuke Fukami, Tokyo (JP)

(73) Assignee: NEC Corporation, Tokyo (JP)

( * ) Notice: Subject to any disclaimer, the term of this patent is extended or adjusted under 35 U.S.C. 154(b) by 140 days.

(21) Appl. No.: 12/518,532

(22) PCT Filed: Oct. 22, 2007

(86) PCT No.: PCT/JP2007/070571
§ 371 (c)(1),
(2), (4) Date: Jun. 10, 2009

(87) PCT Pub. No.: WO2008/072421
PCT Pub. Date: Jun. 19, 2008

(65) Prior Publication Data
US 2010/0008131 A1    Jan. 14, 2010

(30) Foreign Application Priority Data

Dec. 12, 2006    (JP) .................................. 2006-334259

(51) Int. Cl.
*G11C 7/02* (2006.01)
(52) U.S. Cl. .......... 365/209; 365/74; 365/130; 365/158; 365/171; 365/225.5
(58) Field of Classification Search .................... 365/55, 365/66, 74, 130, 158, 171, 173, 209, 225.5
See application file for complete search history.

(56) References Cited

U.S. PATENT DOCUMENTS

| | | | |
|---|---|---|---|
| 6,888,742 | B1 | 5/2005 | Nguyen et al. |
| 7,064,974 | B2 | 6/2006 | Suzuki et al. |
| 7,184,301 | B2 | 2/2007 | Sugibayashi et al. |
| 2005/0002229 | A1 | 1/2005 | Matsutera et al. |
| 2005/0162970 | A1* | 7/2005 | Motoyoshi et al. ........... 365/232 |

FOREIGN PATENT DOCUMENTS

| | | |
|---|---|---|
| JP | 2002056665 A | 2/2002 |
| JP | 2005150303 A | 6/2005 |
| JP | 2005191032 A | 7/2005 |
| WO | 2006090656 A | 8/2006 |

OTHER PUBLICATIONS

International Search Report for PCT/JP2007/070571 mailed Jan. 22, 2008.
M. Hosomi et al., "A Novel Nonvolatile Memory with Spin Torque Transfer Magnetization Switching: Spin-RAM", International Electron Devices Meeting (IEDM), Technical Digest, p. 459-562, 2005.
Yamaguchi et al., "Real-Space Observation of Current-Driven Domain Wall Motion in Submicron Magnetic Wires", Physical Review Letters, vol. 92, No. 7, Feb. 20, 2004, p. 077205-1-4.
Notice of Allowance for U.S. Appl. No. 11/996,711 mailed Dec. 7, 2010.

* cited by examiner

*Primary Examiner* — Huan Hoang
*Assistant Examiner* — Jason Lappas

(57) ABSTRACT

A magnetoresistance effect element according to the present invention comprises a magnetization free layer 1 and a magnetization fixed layer 3 connected to the magnetization free layer 1 through a nonmagnetic layer 2. The magnetization free layer 1 includes a magnetization switching region 13, a first magnetization fixed region 11 and a second magnetization fixed region 12. The magnetization switching region 13 having reversible magnetization overlaps with the magnetization fixed layer 3. The first magnetization fixed region 11 having first fixed magnetization is connected to one end 13a of the magnetization switching region 13. The second magnetization fixed region 12 having second fixed magnetization is connected to the other end 13b of the magnetization switching region 13. The first magnetization fixed region 11 and the magnetization switching region 13 form a three-way intersection, and the second magnetization fixed region 12 and the magnetization switching region 13 form another three-way intersection.

20 Claims, 17 Drawing Sheets

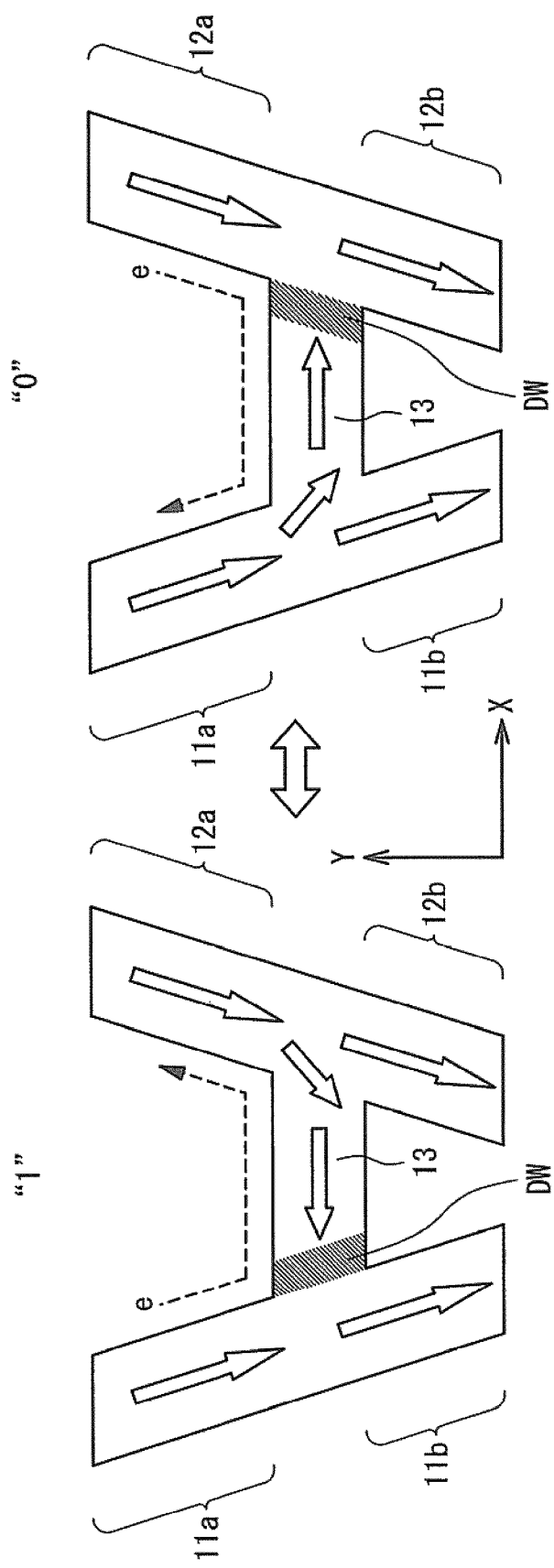

MAGNETORESISTANCE EFFECT ELEMENT AND MRAM

TECHNICAL FIELD

This application is the National Phase of PCT/JP2007/070571, filed Oct. 22, 2007, which is based on Japanese patent application No. 2006-334259 filed on Dec. 12, 2006, and claims the benefit of priority. The entire disclosed content of the patent application is incorporated herein by reference.

The present invention relates to a magnetoresistance effect element and a MRAM (Magnetic Random Access Memory) using the magnetoresistance effect element as a memory cell. In particular, the present invention relates to a MRAM based on a domain wall motion method, and a magnetoresistance effect element used in the MRAM.

BACKGROUND ART

A MRAM is a promising nonvolatile memory from a viewpoint of high integration and a high-speed operation. In the MRAM, a "magnetoresistance effect element" that exhibits a magnetoresistance effect such as a TMR (Tunnel MagnetoResistance) effect is used as a memory cell. In the magnetoresistance effect element, for example, a MTJ (Magnetic Tunnel Junction) in which a tunnel barrier layer is sandwiched by two ferromagnetic layers is formed. The two ferromagnetic layers include a magnetization fixed layer (pinned layer) whose magnetization direction is fixed and a magnetization free layer (free layer) whose magnetization direction is reversible.

It is known that a resistance value (R+ΔR) of the MTJ when the magnetization directions of the magnetization fixed layer and the magnetization free layer are "anti-parallel" to each other becomes larger than a resistance value (R) when they are "parallel" to each other, because of the magnetoresistance effect. An MR ratio (=ΔR/R) at room temperature is a few tens to a few hundreds of %. A memory cell of the MRAM utilizes the change in the resistance value to nonvolatilely store data. Data reading is performed by flowing a read current so as to penetrate through the MTJ and measuring the resistance value of the MTJ. On the other hand, data writing is performed by switching the magnetization direction of the magnetization free layer.

As a typical data writing method, a "current magnetic field method" is known. According to the current magnetic field method, a write current is flowed through a write interconnection arranged in the vicinity of the magnetoresistance effect element. Then, a write magnetic field generated by the write current is applied to the magnetization free layer and thereby the magnetization direction of the magnetization free layer is changed. At this time, a strength of the magnetic field generated by the write current of 1 mA is approximately a few Oe to dozen Oe. Meanwhile, to prevent stored data from being rewritten by thermal disturbance, a magnetic switching field necessary for switching the magnetization of the magnetization free layer is preferably designed to be about a few tens of Oe. Therefore, it is very difficult to achieve the data writing with a write current of 1 mA or less. In this point, the MRAM based on the current magnetic field method is less advantageous than the other RAM. Furthermore, the magnetic switching field necessary for switching the magnetization of the magnetization free layer increases in substantially inverse proportion to a size of the magnetoresistance effect element. That is to say, the write current tends to increase with the miniaturization of the memory cell, which is a problem.

With regard to the MRAM based on the current magnetic field method, Japanese Laid-Open Patent Application No. JP-2005-150303 describes a technique intended to improve thermal disturbance resistance and to reduce the magnetic switching field. A magnetoresistance effect element according to the technique has a ferromagnetic tunnel junction including a three-layer structure of a first ferromagnetic layer/a tunnel barrier layer/a second ferromagnetic layer. The first ferromagnetic layer has larger coercive force as compared with the second ferromagnetic layer. Further, magnetization of an end of the second ferromagnetic layer is fixed in a direction having a component orthogonal to a direction of easy magnetization axis of the second ferromagnetic layer.

As a data write method replacing the current magnetic field method, a "spin transfer method" using spin transfer is recently proposed. Refer to, for example, Japanese Laid-Open Patent Application No. JP-2005-191032 and a literature (M. Hosomi, et al., "A Novel Nonvolatile Memory with Spin Torque Transfer Magnetization Switching: Spin-RAM", International Electron Devices Meeting (IEDM) Technical Digest, pp. 459-562, 2005). According to the spin transfer method, a spin-polarized current is injected into a magnetization free layer, and direct interaction between spin of conduction electrons of the current and magnetic moment of the conductor causes the magnetization to be switched. Since the magnetization switching is more likely to occur as a current density increases, it is possible to decrease the write current as the memory cell size is reduced.

According to the spin transfer method described in the literature (M. Hosomi, et al., "A Novel Nonvolatile Memory with Spin Torque Transfer Magnetization Switching: Spin-RAM", International Electron Devices Meeting (IEDM), Technical Digest, pp. 459-562, 2005), the write current is so flowed as to penetrate through the MTJ. That is, the spin transfer method according to the technique is achieved by a so-called CPP (Current Perpendicular to Plane) method, which is hereinafter referred to as a "vertical spin transfer method". According to the vertical spin transfer method, spin-polarized electrons having the same spin state as that of the magnetization fixed layer are supplied from the magnetization fixed layer to the magnetization free layer, or extracted from the magnetization free layer to the magnetization fixed layer. As a result, the magnetization of the magnetization free layer is reversed due to the spin transfer effect. In this manner, the magnetization direction of the magnetization free layer can be determined depending on a direction of the write current penetrating through the MTJ. Furthermore, it is possible to reduce the write current with the miniaturization of the memory cell.

However, according to the vertical spin transfer method, the write current larger than the read current penetrates through the MTJ, which is considered to cause the following problems. Typically, an insulating film is used as the tunnel barrier layer of the MTJ, and an upper limit value of the write current is determined by a limit of a breakdown voltage of the insulating film. This is not preferable from a view point of writing. On the other hand, if a resistance value of the tunnel barrier layer is lowered in order to increase the upper limit value, it causes decrease in a read signal. This is not preferable from a view point of reading. That is to say, the writing should be performed within a margin more than a current causing the magnetization switching and less than the breakdown voltage of the insulating film meeting read constraint, which is disadvantageous. Furthermore, to flow the write current through the insulating film every time the write operation is performed is not preferable from a view point of durability of the element.

On the other hand, according to the spin transfer method described in Japanese Laid-Open Patent Application No. JP-2005-191032, the write current does not penetrate through the MTJ but flows within the plane of the magnetization free layer. This spin transfer method is hereinafter referred to as a "horizontal spin transfer method". More specifically, the magnetization free layer according to this technique has a connector section overlapping with the tunnel barrier layer, constricted sections adjacent to both ends of the connector section, and a pair of magnetization fixed sections respectively formed adjacent to the constricted sections. The magnetization fixed sections are respectively provided with fixed magnetizations whose directions are opposite to each other. As a result, the magnetization free layer is provided with a domain wall within the above-mentioned connector section.

Within the magnetization free layer thus constructed, the write current is flowed planarly. At this time, the pair of magnetization fixed sections serves as supply sources of different types of spin polarized electrons. A direction of the write current is controlled depending on a write data, and the spin polarized electrons are supplied to the connector section from any of the magnetization fixed sectors depending on the direction. As a result, the magnetization of the magnetization free layer is reversed due to the spin transfer effect. The magnetization reversal means a change in position of the above-mentioned domain wall. That is, the domain wall moves between the pair of constricted sections, depending on the direction of the write current. In this sense, the horizontal spin transfer method as described in Japanese Laid-Open Patent Application No. JP-2005-191032 can also be referred to as a "domain wall motion method".

Such a current-driven domain wall motion has been actually observed in a ferromagnetic fine wire (see Yamaguchi et. al., "Real-Space Observation of Current-Driven Domain Wall Motion in Submicron Magnetic Wires", PRL, vol. 92, pp. 077205-1, 2004). When a current crossing a domain wall flows through the magnetic fine wire that has the domain wall and a width of a few tens nanometers to a few micrometers, the domain wall is moved by spin magnetic moment of the conduction electrons. A current value required for the domain motion also decreases with the miniaturization of the element. Accordingly, the horizontal spin transfer method (domain wall motion method) utilizing the domain wall motion is a very important technique for achieving a large-capacity low-current-operation MRAM.

DISCLOSURE OF INVENTION

The inventor of the present application has recognized the following points. According to the technique described in Japanese Laid-Open Patent Application No. JP-2005-191032, the magnetization free layer is provided with the pair of magnetization fixed sections on both sides of the connector section whose magnetization direction is reversible. The magnetization fixed sections serve as the supply sources of different types of spin polarized electrons and are respectively provided with the fixed magnetizations whose directions are opposite to each other. The connector section and the pair of magnetization fixed sections are linearly arranged. Therefore, if the spin polarized electrons are excessively introduced at a time of data writing, the domain wall may intrude into one of the magnetization fixed sections. This means that the magnetization direction of the one magnetization fixed section is disturbed. In the worst case, the magnetization direction of the one magnetization fixed section is entirely reversed, resulting in disappearance of the domain wall. In this manner, according to the above technique, there is a possibility that the magnetization of the magnetization fixed section becomes unstable when the write current is supplied.

One object of the present invention is to provide a new magnetoresistance effect element and a new MRAM based on the domain wall motion method.

Another object of the present invention is to provide a technique that enables magnetization of a magnetization fixed region in a magnetization free layer to be more stably retained when a write current is supplied to the magnetization free layer.

In a first aspect of the present invention, a magnetoresistance effect element based on the domain wall motion method is provided. The magnetoresistance effect element comprises a magnetization free layer and a magnetization fixed layer connected to the magnetization free layer through a nonmagnetic layer. The magnetization free layer includes a magnetization switching region, a first magnetization fixed region and a second magnetization fixed region. The magnetization switching region overlaps with the magnetization fixed layer and has reversible magnetization. The first magnetization fixed region is connected to one end in a direction of a easy magnetization axis of the magnetization switching region and has first fixed magnetization. The second magnetization fixed region is connected to the other end in a direction of the easy magnetization axis of the magnetization switching region and has second fixed magnetization. The first magnetization fixed region and the magnetization switching region form a three-way intersection, and the second magnetization fixed region and the magnetization switching region form another three-way intersection.

In a second aspect of the present invention, a MRAM based on the domain wall motion method is provided. The MRAM comprises a plurality of magnetic memory cells that are arranged in an array form. Each of the plurality of magnetic memory cells is provided with the above-described magnetoresistance effect element and a transistor for supplying a write current to the magnetization free layer.

According to the magnetoresistance effect element and the MRAM of the present invention, it is possible to stably retain the magnetization of the magnetization fixed region in the magnetization free layer when the write current is supplied to the magnetization free layer. Consequently, an upper limit value allowed as a magnitude of the write current is increased, which enlarges the write margin.

BRIEF DESCRIPTION OF DRAWINGS

FIG. 3 is a diagram for explaining data writing to the magnetoresistance effect element according to the first exemplary embodiment.

BEST MODE FOR CARRYING OUT THE INVENTION

A magnetoresistance effect element and a MRAM according to exemplary embodiments of the present invention will be described below with reference to the attached drawings.

1. First Exemplary Embodiment 1-1. Structure

Figure 1:
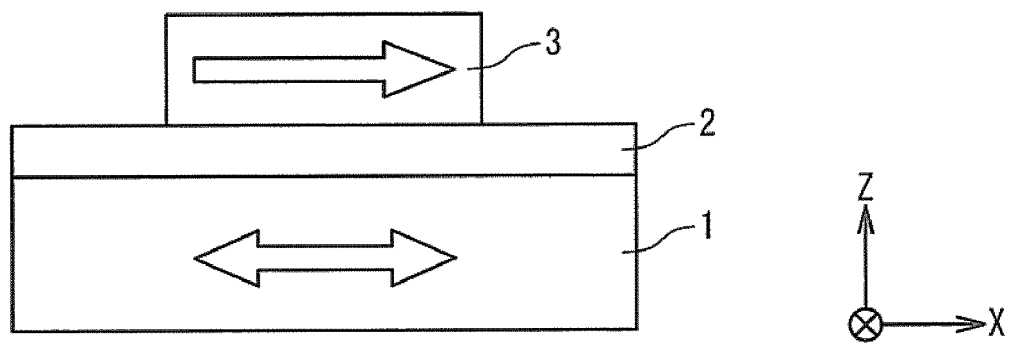
FIG. 1 is a side view schematically showing a structure of a magnetoresistance effect element according to a first exemplary embodiment of the present invention.

FIG. 1 is a side view schematically showing a structure of a magnetoresistance effect element according to a first exemplary embodiment. The magnetoresistance effect element has a stacked structure in which a magnetization free layer 1, a tunnel barrier layer 2 and a magnetization fixed layer 3 are sequentially stacked. In FIG. 1, the stack direction is defined as a "Z direction". That is, a direction perpendicular to a principal surface of each layer is the Z direction. Each layer is formed on an XY plane perpendicular to the Z direction.

The magnetization free layer (free layer) 1 includes a ferromagnetic layer. Also, as will be described in detail later, the magnetization free layer 1 has a region whose magnetization direction is reversible.

The tunnel barrier layer 2 is a nonmagnetic layer. For example, the tunnel barrier layer 2 is formed of an insulating film. The tunnel barrier layer 2 is sandwiched between the magnetization free layer 1 and the magnetization fixed layer 3. In FIG. 1, the tunnel barrier layer 2 has the same width as that of the magnetization free layer 1, but may have the same width as that of the magnetization fixed layer 3. Alternatively, the width of the tunnel barrier layer 2 may vary from the width of the magnetization fixed layer 3 to the width of the magnetization free layer 1 in mid-course.

The magnetization fixed layer (pinned layer) 3 includes a ferromagnetic layer that is in contact with the tunnel barrier layer 2, and a magnetization direction thereof is fixed in one in-plane direction by a not-shown antiferromagnetic layer or the like. For example, in FIG. 1, the magnetization direction of the magnetization fixed layer 3 being in contact with the tunnel barrier layer 2 is fixed in the +X direction. Note that the magnetization fixed layer 3 may have a stacked structure in which a plurality of ferromagnetic layers are magnetically coupled through nonmagnetic layers. In this case, the ferromagnetic layers adjacent to each other are, for example, antiferromagnetically coupled through a nonmagnetic layer. Consequently, a leakage magnetic field from the magnetization fixed layer 3 is reduced and the fixed magnetization becomes more stable.

As described above, the magnetization free layer 1 and the magnetization fixed layer 3 are connected to each other through the tunnel barrier layer 2. The magnetization free layer 1, the tunnel barrier layer 2 and the magnetization fixed layer 3 form an MTJ. In addition to the MTJ, the magnetoresistance effect element is further provided with electrode layers and cap layers (not shown).

Figure 2A:
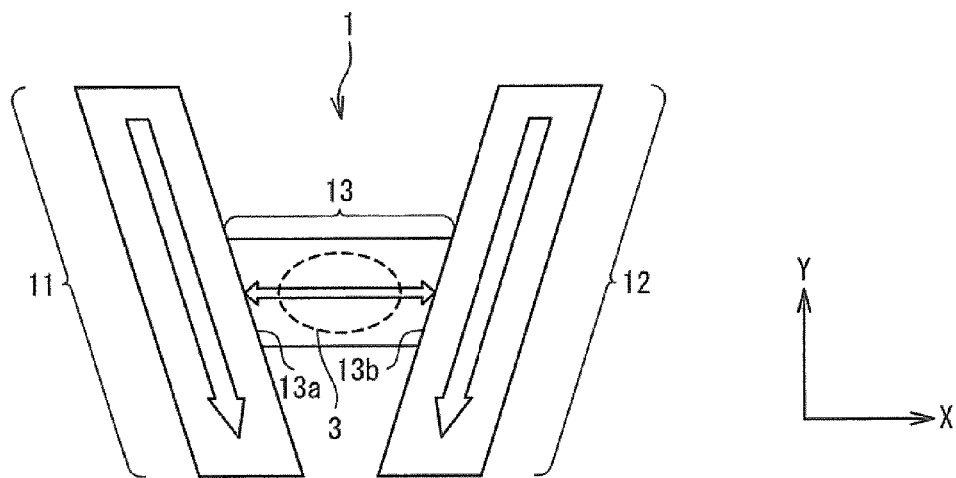
FIG. 2A is a plan view showing a structure of a magnetization free layer of the magnetoresistance effect element according to the first exemplary embodiment.

FIG. 2A is a plan view showing in detail a structure of the magnetization free layer 1 according to the present exemplary embodiment. As shown in FIG. 2A, the magnetization free layer 1 according to the present exemplary embodiment includes a first magnetization fixed region 11, a second magnetization fixed region 12 and a magnetization switching region 13. The first magnetization fixed region 11, the second magnetization fixed region 12 and the magnetization switching region 13 are formed in the same XY plane.

The magnetization switching region 13 is a region being in contact with the tunnel barrier layer 2 and overlaps with the magnetization fixed layer 3 (indicated by a dashed line in FIG. 2A). That is, the magnetization switching region 13 of the magnetization free layer 1, the tunnel barrier layer 2 and the magnetization fixed layer 3 form the MTJ. A longitudinal direction, namely, an easy magnetization axis of the magnetization switching region 13 aligns with the X direction. The magnetization direction of the magnetization switching region 13 is reversible and allowed to be the +X direction or the −X direction. In other words, the magnetization direction of the magnetization switching region 13 can be "parallel" or "anti-parallel" to the magnetization direction of the magnetization fixed layer 3.

The first magnetization fixed region 11 is connected to one end (first end) 13a in the X direction (direction of the easy magnetization axis) of the magnetization switching region 13. In other words, a side of the first magnetization fixed region 11 and the first end 13a of the magnetization switching region 13 are in contact with each other. That is, the first magnetization fixed region 11 and the magnetization switching region 13 form a three-way intersection. On the other hand, the second magnetization fixed region 12 is connected to the other end (second end) 13b in the X direction of the magnetization switching region 13. In other words, a side of the second magnetization fixed region 12 and the second end 13b of the magnetization switching region 13 are in contact with each other. That is, the second magnetization fixed region 12 and magnetization switching region 13 form another three-way intersection.

Figure 2B:
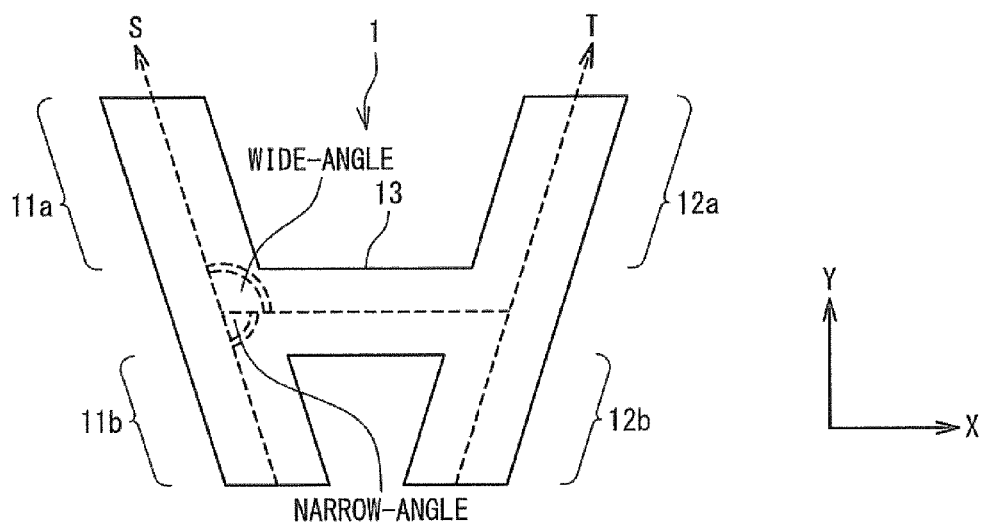
FIG. 2B is a plan view showing a structure of the magnetization free layer of the magnetoresistance effect element according to the first exemplary embodiment.
Figure 4A:
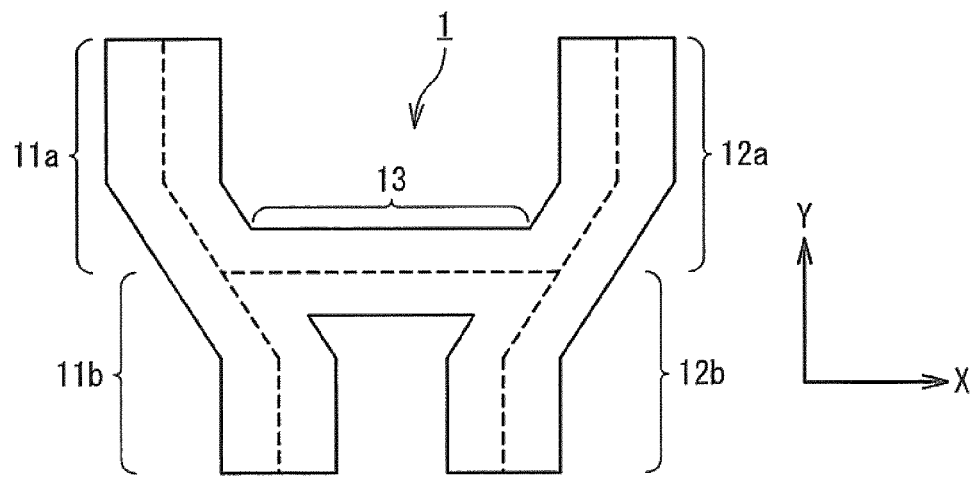
FIG. 4A is a plan view showing a modification example of the magnetization free layer according to the first exemplary embodiment.
Figure 4B:
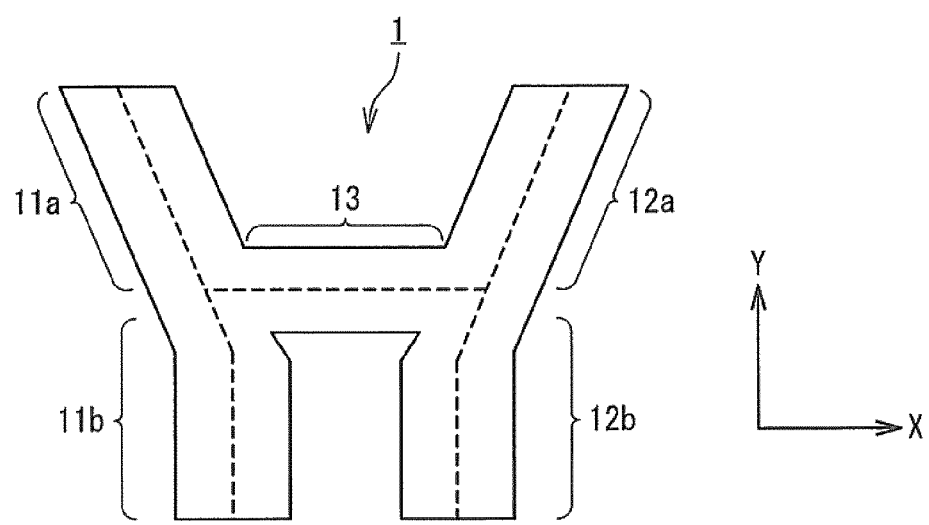
FIG. 4B is a plan view showing another modification example of the magnetization free layer according to the first exemplary embodiment.
Figure 4C:
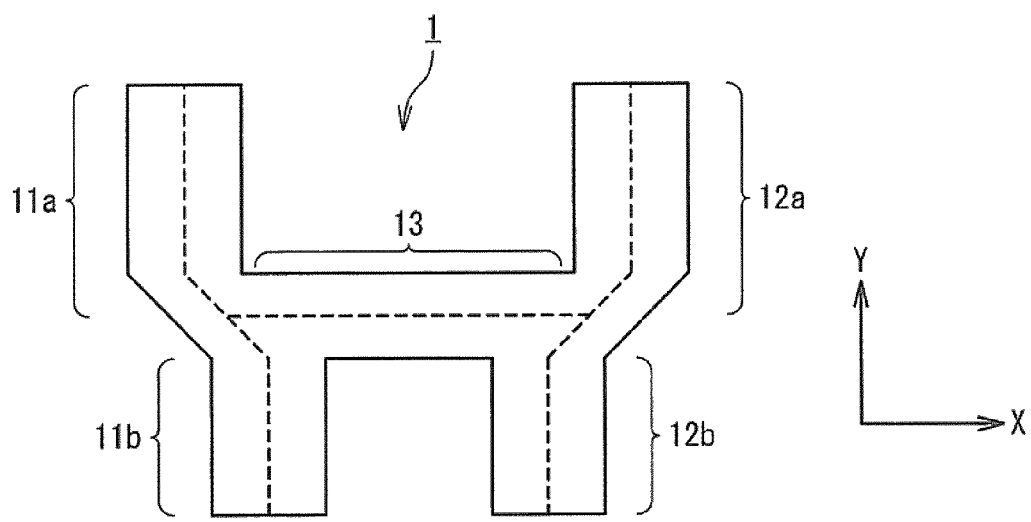
FIG. 4C is a plan view showing still another modification example of the magnetization free layer according to the first exemplary embodiment.
Figure 4D:
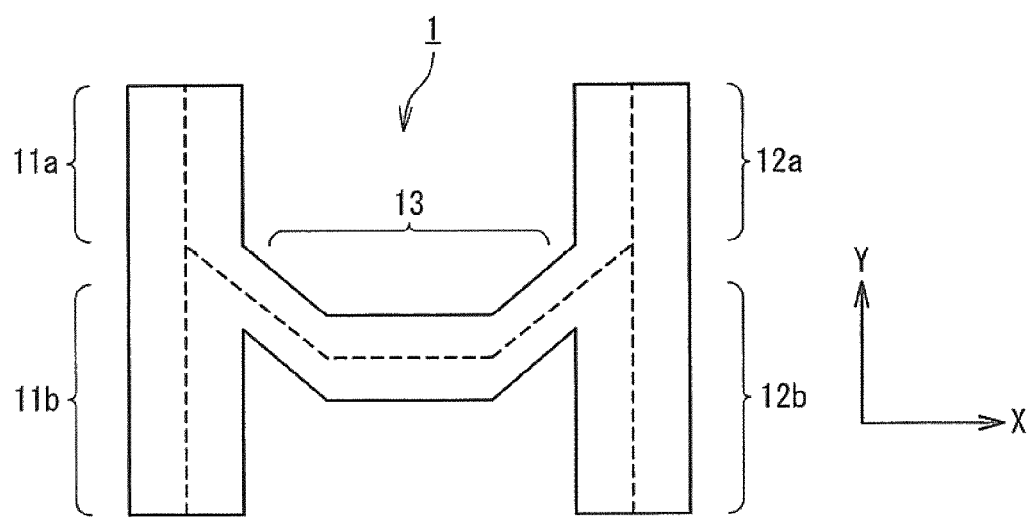
FIG. 4D is a plan view showing still another modification example of the magnetization free layer according to the first exemplary embodiment.

More specifically, as shown in FIG. 2B, the first magnetization fixed region 11 is formed along an S-axis intersecting with the X-axis. In this case, a wide-angle and a narrow-angle are formed at the above-mentioned three-way intersection due to the intersection of the X-axis and the S-axis. A section of the first magnetization fixed region 11 extending on the wide-angle side is hereinafter referred to as a "first wide-angle section 11a", and a section extending on the narrow-angle side is hereinafter referred to as a "first narrow-angle section 11b". The first wide-angle section 11a forms an angle of 90 degrees or more with the easy magnetization axis of the magnetization switching region 13. On the other hand, the first narrow-angle section 11b forms an angle of 90 degrees or less with the easy magnetization axis of the magnetization switching region 13.

Similarly, the second magnetization fixed region 12 is formed along a T-axis intersecting with the X-axis. In this case, a wide-angle and a narrow-angle are formed at the above-mentioned three-way intersection due to the intersection of the X-axis and the T-axis. A section of the second magnetization fixed region 12 extending on the wide-angle side is hereinafter referred to as a "second wide-angle section 12a", and a section extending on the narrow-angle side is hereinafter referred to as a "second narrow-angle section 12b". The second wide-angle section 12a forms an angle of 90 degrees or more with the easy magnetization axis of the magnetization switching region 13. On the other hand, the second narrow-angle section 12b forms an angle of 90 degrees or less with the easy magnetization axis of the magnetization switching region 13.

Magnetizations of the first magnetization fixed region 11 and the second magnetization fixed region 12 are respectively fixed along the longitudinal directions by magnetic anisotropy. For example, in FIGS. 2A and 2B, the magnetization (first fixed magnetization) of the first magnetization fixed region 11 is fixed in a direction from the first wide-angle section 11a toward the first narrow-angle section 11b, and the magnetization (second fixed magnetization) of the second magnetization fixed region 12 is fixed in a direction from the second wide-angle section 12a toward the second narrow-angle section 12b. Alternatively, the magnetization of the first magnetization fixed region 11 may be fixed in a direction from the first narrow-angle section 11b toward the first wide-angle section 11a, and the magnetization of the second magnetization fixed region 12 may be fixed in a direction from the second narrow-angle section 12b toward the second wide-angle section 12a. In either case, an X-component of the fixed magnetization is opposite in direction between the first magnetization fixed region 11 and the second magnetization fixed region 12.

Note that pinning layers (not shown) may be used for stably fixing the magnetization directions of the first magnetization fixed region 11 and the second magnetization fixed region 12. In that case, a first pinning layer is provided near the first magnetization fixed region 11 or adjacent to the first magnetization fixed region 11. The first pinning layer is formed of ferromagnetic or anti-ferromagnetic, and is magnetically coupled to the first magnetization fixed region 11. Also, a second pinning layer is provided near the second magnetization fixed region 12 or adjacent to the second magnetization fixed region 12. The second pinning layer is formed of ferromagnetic or anti-ferromagnetic, and is magnetically coupled with the second magnetization fixed region 12. The magnetic coupling includes exchange coupling and magnetostatic coupling.

1-2. Principle of Operation

FIG. 3 illustrates two types of magnetization state of the magnetization free layer 1 according to the present exemplary embodiment. In a case where the magnetization direction of the magnetization switching region 13 is the −X direction, i.e., where the direction is anti-parallel to the magnetization direction (+X direction) of the magnetization fixed layer 3, a resistance value of the MTJ is relatively large. This anti-parallel state is related to, for example, data "1". On the other hand, in a case where the magnetization direction of the magnetization switching region 13 is the +X direction, i.e., where the direction is parallel to the magnetization direction (+X direction) of the magnetization fixed layer 3, the resistance value of the MTJ is relatively small. This parallel state is related to, for example, data "0".

In the case of the data "1", the magnetization (−X direction) of the magnetization switching region 13 is continuously connected from the second wide-angle section 12a of the second magnetization fixed region 12. Since the magnetization of the first magnetization fixed region 11 has the +X directional component at the three-way intersection, a domain wall DW exists at the first end 13a of the magnetization switching region 13. On the other hand, in the case of the data "0", the magnetization (+X direction) of the magnetization switching region 13 is continuously connected from the first wide-angle section 11a of the first magnetization fixed region 11. Since the magnetization of the second magnetization fixed region 12 has the −X directional component at the three-way intersection, the domain wall DW exists at the second end 13b of the magnetization switching region 13. In this manner, the domain wall DW is introduced in the magnetization free layer 1, because the X-component of the fixed magnetization is opposite in direction between the first magnetization fixed region 11 and the second magnetization fixed region 12. The data "1" and "0" can be distinguished from each other, depending on the position of the domain wall DW. It should be noted that the two states are equivalent in terms of energy.

Data reading is performed by detecting the resistance value of the MTJ. More specifically, a read current is flowed between the magnetization fixed layer 3 and the magnetization free layer 1 so as to pass through the MTJ. On the basis of the read current, the resistance value of the MTJ is detected and the data "1" or "0" is sensed.

Data writing is performed by the "horizontal spin transfer method". That is, a write current does not penetrate through the MTJ but flows within the plane of the magnetization free layer 1. More specifically, according to the present exemplary embodiment, the write current is flowed from the wide-angle section of one of the magnetization fixed regions to the wide-angle section of the other magnetization fixed region through the magnetization switching region 13. At this time, the first wide-angle section 11a of the first magnetization fixed region 11 serves as a spin supply source that supplies electrons having magnetic moment of the +X direction (+X directional spin polarized electrons) to the magnetization switching region 13. On the other hand, the second wide-angle section 12a of the second magnetization fixed region 12 serves as a spin supply source that supplies electrons having magnetic moment of the −X direction (−X directional spin polarized electrons) to the magnetization switching region 13.

For example, when the stored data is changed from "1" to "0", the write current is flowed from the second wide-angle section 12a to the first wide-angle section 11a. In this case, as shown in FIG. 3, electrons flow from the first wide-angle section 11a to the second wide-angle section 12a. At this time, the +X directional spin polarized electrons flow from the first wide-angle section 11a into the magnetization switching region 13. As a result, the magnetization of the magnetization switching region 13 is reversed to the +X direction due to the spin transfer effect. On the other hand, when the stored data is changed from "0" to "1", the write current is flowed from the first wide-angle section 11a to the second wide-angle section 12a. In this case, electrons flow from the second wide-angle section 12a to the first wide-angle section 11a. At this time, the −X directional spin polarized electrons flow from the second wide-angle section 12a into the magnetization switching region 13. As a result, the magnetization of the magnetization switching region 13 is reversed to the −X direction due to the spin transfer effect. In this manner, it is possible to achieve the data writing by controlling the direction of the write current flowing within the magnetization free layer 1.

The data writing can also be described from the perspective of the domain wall motion. At a time of the data writing from "1" to "0", the +X directional spin polarized electrons flow into the magnetization switching region 13 through the domain wall DW. As a result, the domain wall DW moves toward the +X direction from the first end 13a and then reaches the second end 13b. On the other hand, at a time of the data writing from "0" to "1", the −X directional spin polarized electrons flow into the magnetization switching region 13 through the domain wall DW. As a result, the domain wall DW moves toward the −X direction from the second end 13b and then reaches the first end 13a. It can be said that the data writing in the present exemplary embodiment is achieved by the "domain wall motion method".

Note that it is confirmed that the above-described writing is possible even if the angle formed by the wide-angle section 11a or 12a or narrow-angle section 11b or 12b and the magnetization switching region 13 is 90 degrees. However, the spin component contributing to the domain wall motion is increased as the angle formed by the wide-angle section 11a or 12a and the magnetization switching region 13 becomes larger within a range of 90 to 180 degrees. Consequently, a write efficiency is improved and thus the write current can be further reduced. In this sense, the angle formed by the wide-angle section 11a or 12a and the magnetization switching region 13 is preferably larger than 90 degrees as shown in the figure.

According to the present exemplary embodiment, the magnetization switching region 13 and each of the magnetization fixed regions 11 and 12 form the three-way intersection, and thus the magnetization free layer 1 has the narrow-angle sections 11b and 12b in which the write current does not flow. Functions of the narrow-angle sections 11b and 12b are as follows.

For the purpose of explanation, let us consider a case where there are no narrow-angle sections 11b and 12b. In this case, if the spin polarized electrons are excessively supplied, the domain wall DW may cross over the end of the magnetization switching region 13 to intrude into the wide-angle section of one of the magnetization fixed regions. In the worst case, the domain wall DW reaches an end of the one magnetization fixed region, and thereby the magnetization direction of the wide-angle section is entirely reversed. That is, the magnetization of the magnetization free layer 1 is continuously connected from one of the wide-angle sections to the other wide-angle section through the magnetization switching region 13. In this case, the magnetization switching region 13 is no longer reversed even if electrons are flowed in the opposite direction. In this manner, if the narrow-angle sections 11b and 12b do not exist, the fixed magnetizations of the magnetization fixed regions 11 and 12 may become unstable when the write current is supplied.

According to the present exemplary embodiment, the wide-angle section 11a of the first magnetization fixed region 11 is magnetically influenced by the narrow-angle section 11b in which the write current does not flow. The magnetization of the wide-angle section 11a is continuously connected to the magnetization of the narrow-angle section 11b and is stabilized by the magnetization of the narrow-angle section 11b. Therefore, at a time of the data writing, the domain wall DW hardly intrudes into the wide-angle section 11a, and stops near the end of the magnetization switching region 13. In other words, the narrow-angle section 11b prevents the domain wall motion in the wide-angle section 11a. The same can be applied to the narrow-angle section 12b. As described above, by forming the three-way intersection by using the magnetization switching region 13 and each of the magnetization fixed regions 11 and 12, it is possible to stably retain the magnetizations of the magnetization fixed regions 11 and 12. This means increase in an upper limit value allowed as a magnitude of the write current and thus enlargement of the write margin.

1-3. Various Shapes of Magnetization Free Layer

FIGS. 4A to 4D are diagrams similar to the foregoing FIG. 2B and show various modification examples of the magnetization free layer 1. In any of the modification examples, the magnetization free layer 1 has the first magnetization fixed region 11, the second magnetization fixed region 12 and the magnetization switching region 13. The first magnetization fixed region 11 and the magnetization switching region 13 form a three-way intersection, and the first magnetization fixed region 11 includes the wide-angle section 11a and the narrow-angle section 11b. Also, the second magnetization fixed region 12 and the magnetization switching region 13 also form a three-way intersection, and the second magnetization fixed region 12 includes the wide-angle section 12a and the narrow-angle section 12b. A width and a length of each region and angles can be designed arbitrarily.

As in the case of the example shown in FIG. 2A, the X-component of the fixed magnetization at the three-way intersection is opposite between the first wide-angle section 11a and the second wide-angle section 12a in any of the modification examples. Therefore, the data writing can be achieved by the method shown in FIG. 3. It should be noted that in the examples shown in FIGS. 2A and 4A to 4D, the first magnetization fixed region 11 and the second magnetization fixed region 12 are mirror symmetric to each other with sandwiching the magnetization switching region 13. This is preferable in that an injection efficiency of the spin polarized electrons balances between at the data "1" writing and at the data "0" writing and thus variation in the write efficiency can be suppressed.

1-4. Various Shapes of Magnetization Switching Region

Figure 5A:
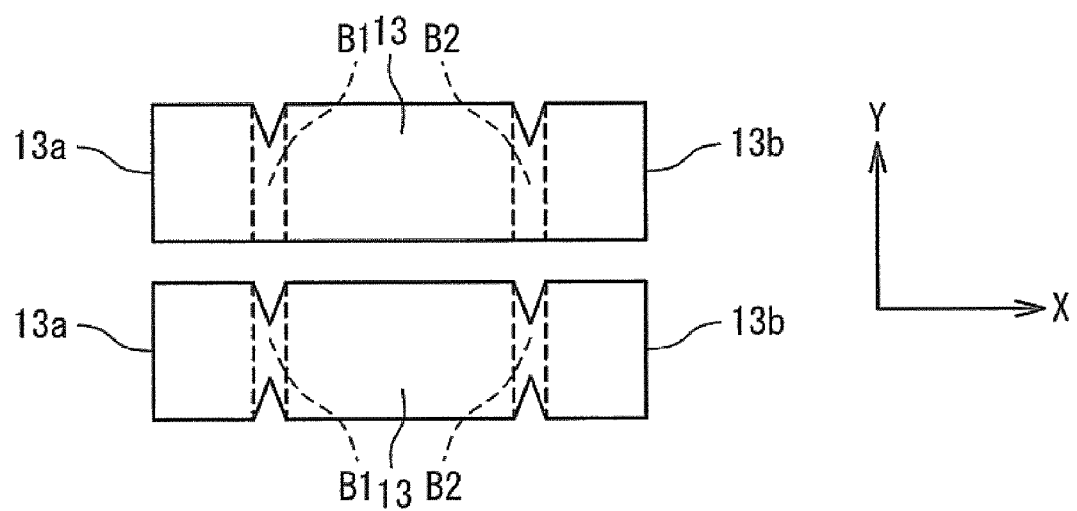
FIG. 5A is a plan view showing an example of a shape of a magnetization switching region included in the magnetization free layer.
Figure 5B:
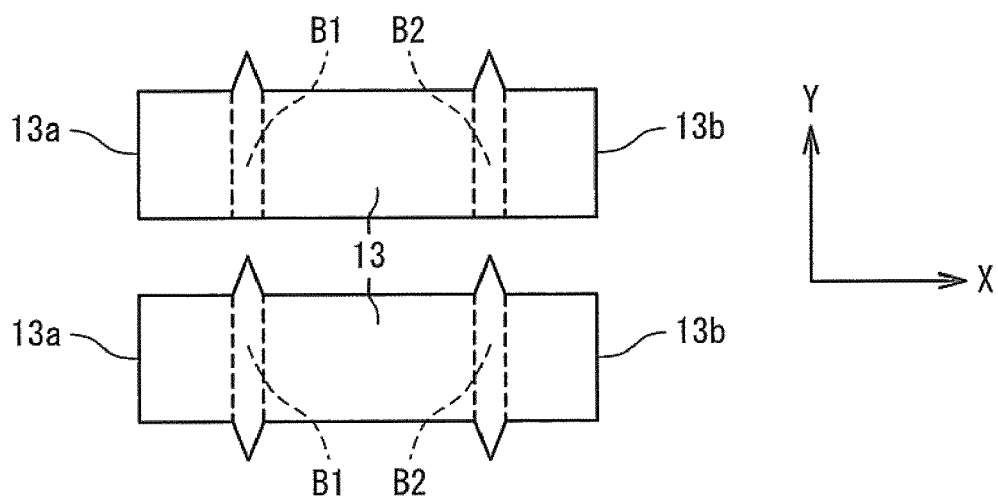
FIG. 5B is a plan view showing another example of the shape of the magnetization switching region included in the magnetization free layer.
Figure 5C:
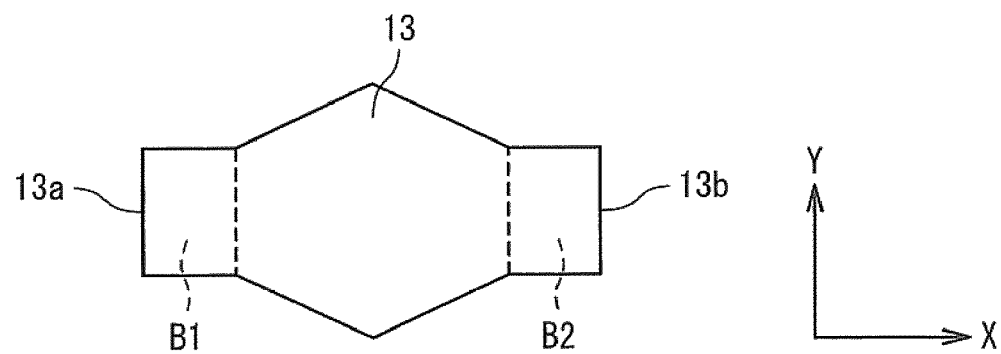
FIG. 5C is a plan view showing still another example of the shape of the magnetization switching region included in the magnetization free layer.

FIGS. 5A to 5C illustrate various modification examples of the magnetization switching region 13 of the magnetization free layer 1. In any of the modification examples, the magnetization switching region 13 includes a first region B1 located on the side of the first end 13a with respect to an intermediate portion and a second region B2 located on the side of the second end 13b with respect to the intermediate portion. A cross-sectional area of the first region B1 and the second region B2 each is different from a cross-sectional area of the intermediate portion. From the perspective of energy, the domain wall DW becomes more stable as an area thereof is smaller.

In the example shown in FIG. 5A, concave portions are respectively formed on sides of the first region B1 and the second region B2. Therefore, the cross-sectional areas of the first region B1 and the second region B2 are smaller than that of the intermediate portion. Consequently, at a time of the data writing, the domain wall DW is likely to stop at the first region B1 or the second region B2. In the example shown in FIG. 5B, convex portions are respectively formed on sides of the first region B1 and the second region B2. Therefore, the cross-sectional areas of the first region B1 and the second region B2 are larger than that of the intermediate portion. Consequently, at a time of the data writing, the domain wall DW is likely to stop before the first region B1 or the second region B2. In the example shown in FIG. 5C, the intermediate portion is formed thicker than the first region B1 and the second region B2. In this case, the domain wall DW is prevented from stopping around the intermediate portion. In this manner, operation characteristics are improved by providing the magnetization switching region 13 with the first region B1 and the second region B2.

1-5. Materials

As materials for the magnetization free layer 1 and the magnetization fixed layer 3, for example, Fe (iron), Co (cobalt), Ni (nickel), or alloy mainly containing them can be used. In particular, Fe—Ni, Fe—Co—Ni, and Fe—Co are desirable. Also, by adding nonmagnetic element to such magnetic materials, a magnetic characteristic, crystallinity, a mechanical characteristic, a chemical characteristic may be adjusted. The nonmagnetic elements to be added include Ag (silver), Cu (copper), Au (gold), B (boron), C (carbon), N (nitrogen), O (oxygen), Mg (magnesium), Al (aluminum), Si (silicon), P (phosphorous) Ti (titanium), Cr (chromium), Zr (zirconium), Nb (niobium), Mo (molybdenum), Hf (hafnium), Ta (tantalum), W (tungsten), Pd (palladium), Pt (platinum) and the like. In this case, materials such as Ni—Fe—Zr, Co—Fe—B and the like are exemplified.

The magnetic free layer 1 is a layer in which the domain wall moves, and preferably has a crystal structure capable of achieving smooth domain wall motion. A lattice defect and a grain boundary can be sinning sites that prevent the smooth domain wall motion. Accordingly, the magnetization free layer 1 preferably has a structure not containing the pinning sites so much, such as an amorphous structure or a single crystalline structure. The amorphous structure can be achieved by adding P, Si, B, or C to a magnetic material, depositing a film in a nitrogen atmosphere, controlling a deposition rate, depositing a film with cooling a substrate, or taking another means. Also, by depositing a film with heating a substrate, or appropriately selecting a seed layer for crystal growth, single crystallinity can be improved.

On the other hand, regarding the magnetization fixed layer 3, it is preferable to use a material having large coercive force in order to prevent magnetization reversal. Also, in order to obtain a wide operating margin and a high signal-to-noise ratio (SN ratio) at a time of the read operation, it is preferable to select a magnetic material enabling a high MR ratio to be obtained. Specifically, as a material for the magnetization fixed layer 3, it is preferable to select Fe, Co, Ni, or alloy containing them. By adding a 4d or 5d transition metal element or rare earth element to such the magnetic material, a magnetic characteristic of the magnetic material can be adjusted.

As a material for the tunnel barrier layer 2, an insulator such as $Al_2O_3$ (aluminum oxide), $SiO_2$ (silicon oxide), MgO (magnesium oxide) or AlN (aluminum nitride) can be used. Also, as a material for the tunnel barrier layer 2, a nonmagnetic metal such as Cu, Cr, Al or Zn (zinc) may be used.

1-6. Effects

Principal effects obtained by the present exemplary embodiment are as follows.

First, since the data writing is performed based on the spin transfer method, the write current can be reduced with miniaturization of the element. In other words, the minimum current value required for the data writing becomes smaller. This means enlargement of the write margin.

Moreover, since the data writing is performed based on the horizontal spin transfer method, the write current does not penetrate through the MTJ. It is not necessary to flow the write current through the tunnel barrier layer 2 for every write, and thereby deterioration of the tunnel barrier layer 2 is suppressed. Furthermore, a read characteristic depends on properties of the MTJ including the tunnel barrier layer 2, whereas a write characteristic depends only on properties of the magnetization free layer 1. It is therefore possible to design the read characteristic and the write characteristic almost independently of each other. In other words, it is possible to design the write characteristic without largely restricted by the read characteristic. That is to say, design freedom of the write characteristic is improved. This also contributes to the enlargement of the write margin.

Furthermore, according to the present exemplary embodiment, the three-way intersection is formed by the magnetization switching region 13 and each of the magnetization fixed regions 11 and 12. Therefore, the magnetization free layer 1 has the narrow-angle sections 11b and 12b. As described above, the narrow-angle sections 11b and 12b respectively play the roles of stabilizing the magnetizations of the wide-angle sections 11a and 12a and prevent the domain wall DW from intruding into the wide-angle sections 11a and 12a. In other words, it is possible t6 stably retain the magnetizations of the magnetization fixed regions 11 and 12 when the write current is supplied to the magnetization free layer 1. This means increase in an upper limit value allowed as a magnitude of the write current and thus enlargement of the write margin.

2. Second Exemplary Embodiment

In a second exemplary embodiment, the same reference numerals are given to the same components as those described in the first exemplary embodiment, and an overlapping description will be omitted as appropriate.

Figure 6:
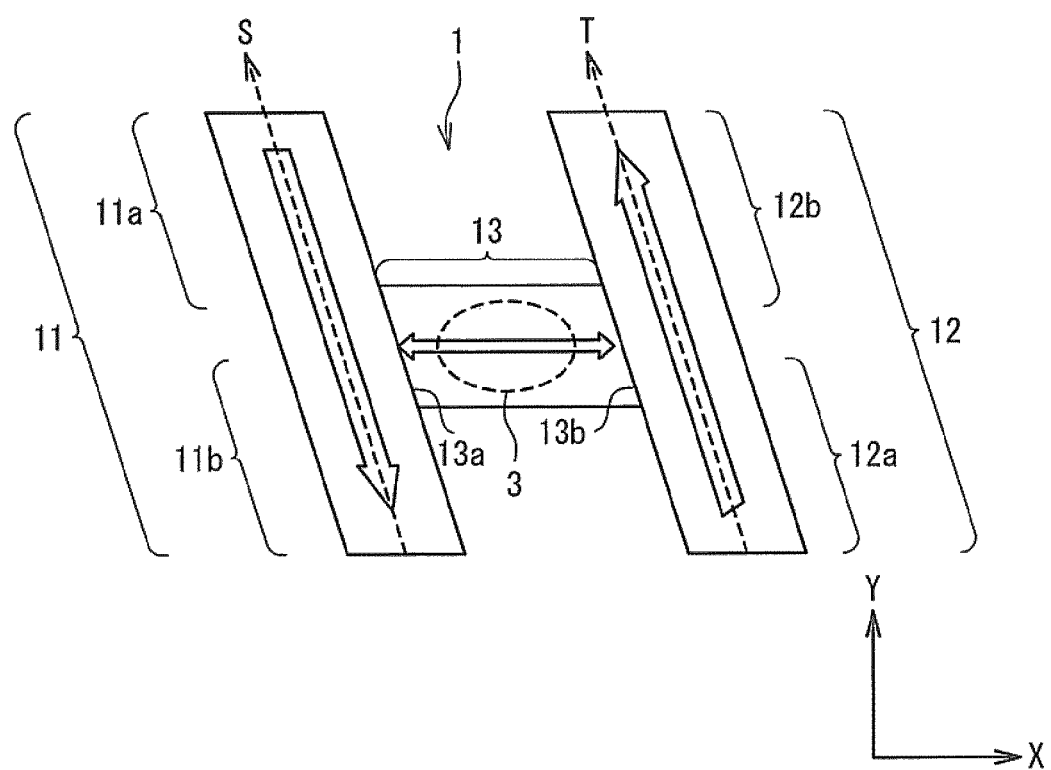
FIG. 6 is a plan view showing a structure of a magnetization free layer of a magnetoresistance effect element according to a second exemplary embodiment of the present invention.

FIG. 6 is a plan view showing a structure of the magnetization free layer 1 according to the second exemplary embodiment. In the present exemplary embodiment, the S-axis alone which the first magnetization fixed region 11 is formed and the T-axis along which the second magnetization fixed region 12 is formed are almost parallel to each other. Also, the first magnetization fixed region 11 and the second magnetization fixed region 12 are rotationally symmetric to each other around the magnetization switching region 13. The wide-angle section 11a of the first magnetization fixed region 11 faces to the narrow-angle section 12b of the second magnetization fixed region 12, and the narrow-angle section 11b of the first magnetization fixed region 11 faces to the wide-angle section 12a of the second magnetization fixed region 12.

A fix direction of the magnetization (first fixed magnetization) of the first magnetization fixed region 11 and a fix direction of the magnetization (second fixed magnetization) of the second magnetization fixed region 12 are the same as those in the first exemplary embodiment. That is, the first fixed magnetization is fixed in a direction from the first wide-angle section 11a toward the first narrow-angle section 11b, and the second fixed magnetization is fixed in a direction from the second wide-angle section 12a toward the second narrow-angle section 12b (see FIG. 6). Alternatively, the first fixed magnetization may be fixed in a direction from the first narrow-angle section 11b toward the first wide-angle section 11a, and the second fixed magnetization may be fixed in a direction from the second narrow-angle section 12b toward the second wide-angle section 12a. In either case, the X-component of the fixed magnetization at the three-way intersection is opposite between the first wide-angle section 11a and the second wide-angle section 12a. It should be noted that the directions of the first fixed magnetization and the second fixed magnetization are anti-parallel to each other, which is different from the first exemplary embodiment.

Figure 7:
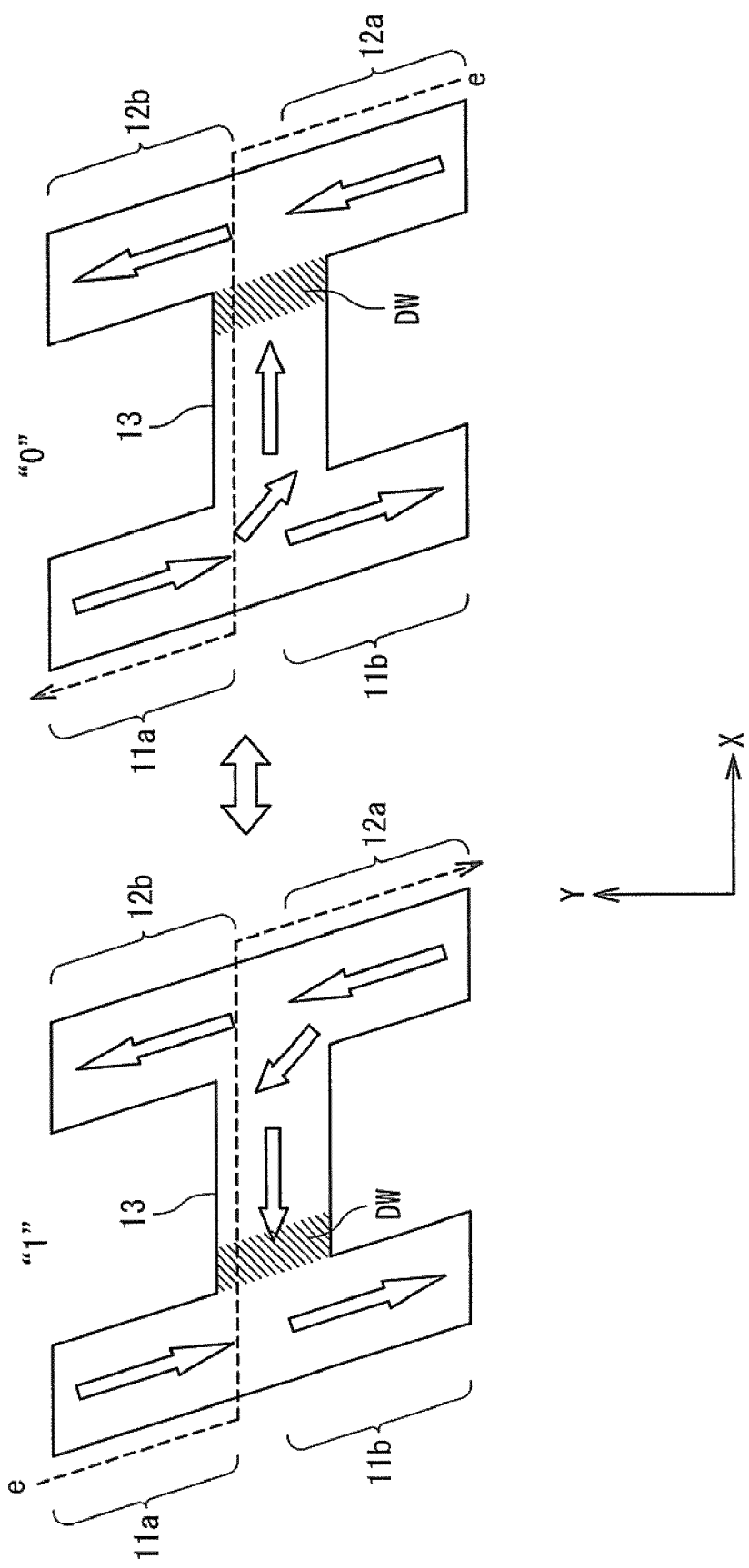
FIG. 7 is a diagram for explaining data writing to the magnetoresistance effect element according to the second exemplary embodiment.

FIG. 7 illustrates two types of magnetization state of the magnetization free layer 1 according to the present exemplary embodiment. The data writing is performed in the same manner as in the first exemplary embodiment. That is, the write current is flowed from one of the wide-angle sections to the other within the magnetization free layer 1. For example, when the stored data is changed from "1" to "0", electrons flow from the first wide-angle section 11a to the second wide-angle section 12a. Accordingly, the domain wall DW moves toward the +X direction from the first end 13a and then reaches the second end 13b. On the other hand, when the stored data is changed from "0" to "1", electrons flow from the second wide-angle section 12a to the first wide-angle sections 11a. Accordingly, the domain wall DW moves toward the −X direction from the second end 13b and then reaches the first end 13a.

The same effects as in the case of the first exemplary embodiment can also be obtained by the structure according to the present exemplary embodiment. Note that modification examples similar to those shown in FIGS. 4A to 4D are possible as a shape of the magnetization free layer 1. Also, the various modification examples shown in FIGS. 5A to 5C can be applied to the magnetization switching region 13.

3. Third Exemplary Embodiment

In a third exemplary embodiment, the same reference numerals are given to the same components as those described in the foregoing exemplary embodiments, and an overlapping description will be omitted as appropriate.

Figure 8:
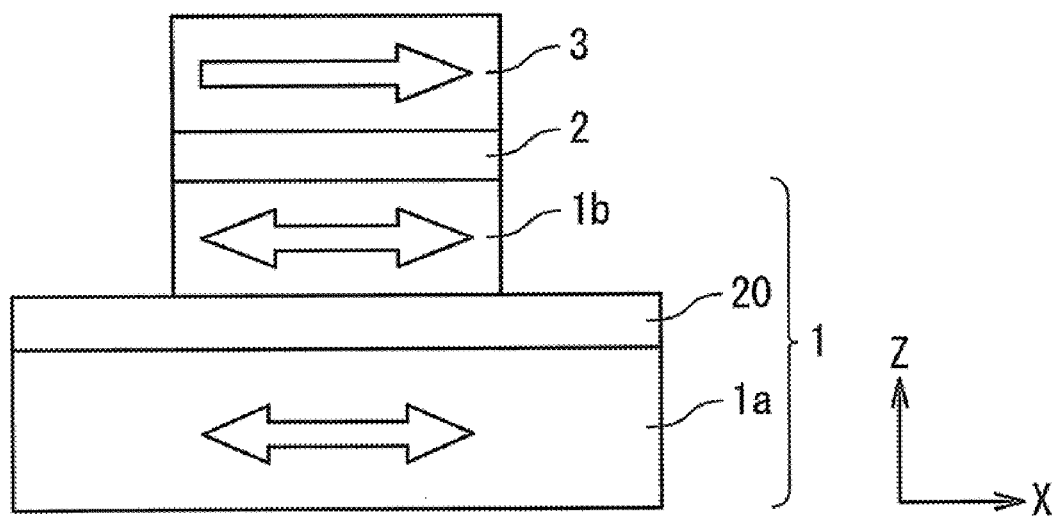
FIG. 8 is a side view schematically showing a structure of a magnetoresistance effect element according to a third exemplary embodiment of the present invention.

FIG. 8 is a side view schematically showing a structure of the magnetoresistance effect element according to the third exemplary embodiment. According to the present exemplary embodiment, the magnetization free layer 1 has a plurality of ferromagnetic layers magnetically coupled to each other. For example, in FIG. 8, the magnetization free layer 1 has a stacked structure in which a first magnetization free layer 1a, a nonmagnetic layer 20 and a second magnetization free layer 1b are sequentially stacked. Among them, the second magnetization free layer 1b is in contact with the tunnel insulating layer 2. The first magnetization free layer 1a and the second magnetization free layer 1b are connected through the nonmagnetic layer 20 and are ferromagnetically or anti-ferromagnetically coupled to each other.

At least one of the magnetization free layers 1a and 1b has the magnetization fixed regions 11, 12 and magnetization switching region 13 shown in any of the foregoing exemplary embodiments. For example, both of the magnetization free layers 1a and 1b may have the magnetization fixed regions 11, 12 and the magnetization switching region 13. The write current may be flowed through both of or one of the magnetization free layers 1a and 1b. In the case where the write current is flowed through one of the magnetization free layers and when the magnetization of the magnetization switching region 13 thereof is reversed, the magnetization of the magnetization switching region 13 of the other magnetization free layer also is reversed concurrently.

In the example shown in FIG. 8, the first magnetization free layer 1a has the magnetization fixed regions 11, 12 and the magnetization switching region 13, while the second magnetization free layer 1b has the magnetization switching region 13 only. In this case, the write current is flowed only in the first magnetization free layer 1a. When the magnetization of the magnetization switching region 13 of the first magnetization free layer 1a is reversed, the magnetization of the magnetization switching region 13 of the second magnetization free layer 1b also is reversed concurrently. The write characteristic depends only on the first magnetization free layer 1a. Meanwhile, the second magnetization free layer 1b forms the MTJ together with the tunnel barrier layer 2 and the magnetization fixed layer 3, and thus contributes to the read characteristic. It is therefore possible to control the write characteristic and the read characteristic independently of each other. The write characteristic can be optimized by forming the first magnetization free layer 1a with a material suitable for the domain wall motion. Meanwhile, the read characteristic can be improved by forming the second magnetization free layer 1b with a material exhibiting a large MR ratio. These are effects obtainable particularly because of the horizontal spin transfer method.

Although the nonmagnetic layer 20 has the same width as that of the first magnetization free layer 1a in FIG. 8, the nonmagnetic layer 20 may have the same width as that of the second magnetization free layer 1b. Alternatively, the width of the nonmagnetic layer 20 may vary from the width of the second magnetization free layer 1b to the width of the first magnetization free layer 1a in mid-course. The nonmagnetic layer 20 can play a role of protecting the first magnetization free layer 1a in which the domain wall moves from damages due to oxidation or etching during a manufacturing process. In this sense, it is preferable that the nonmagnetic layer 20 is so formed as to completely cover a surface of the first magnetization free layer 1a as shown in FIG. 8.

4. Fourth Exemplary Embodiment

Figure 9:
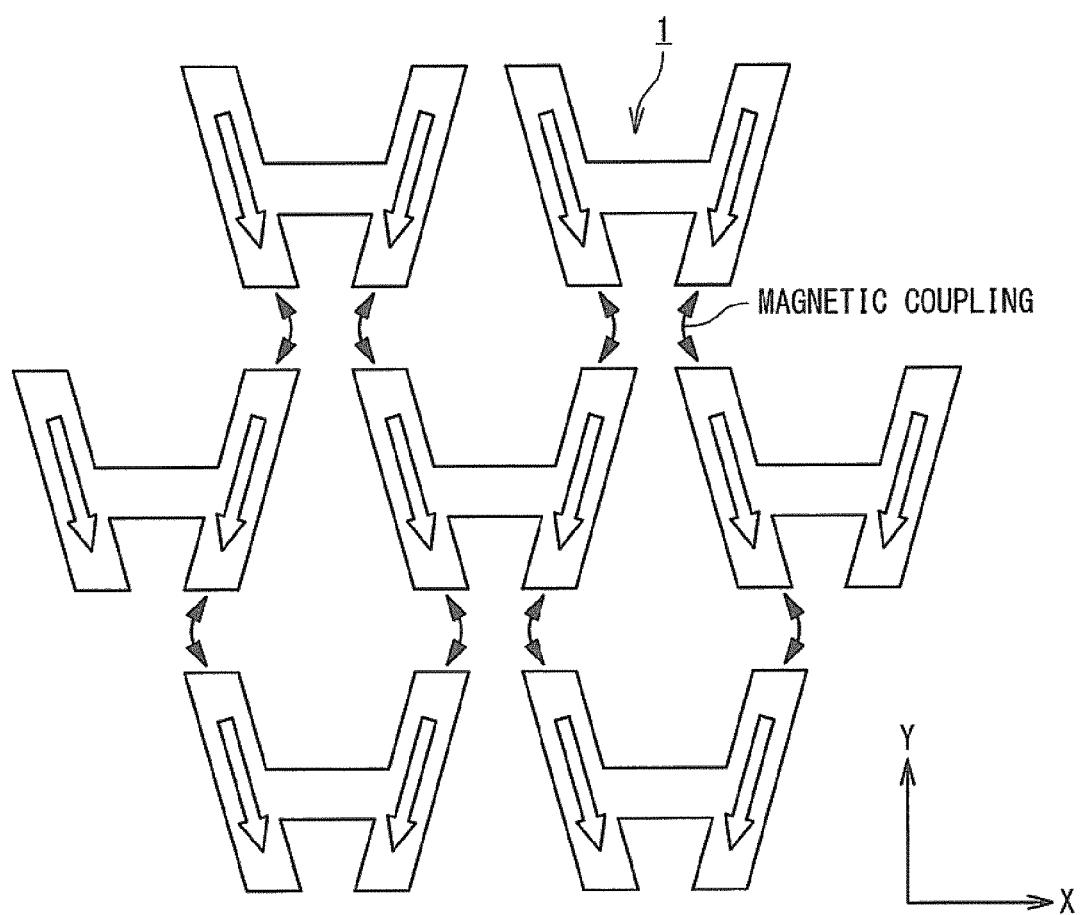
FIG. 9 is a plan view showing an example of arrangement of a group of magnetoresistance effect elements according to a fourth exemplary embodiment of the present invention.

FIG. 9 is a plan view showing an example of arrangement of a plurality of magnetoresistance effect elements. In FIG. 9, the plurality of magnetoresistance effect elements (bits) are arranged in an array form. Moreover, the magnetization fixed regions of the magnetization free layers 1 are magnetically coupled to each other between adjacent magnetoresistance effect elements. This enables the fixed magnetizations of the magnetization fixed regions 11 and 12 to be further stabilized.

5. Fifth Exemplary Embodiment

In a fifth exemplary embodiment, the same reference numerals are given to the same components as those described in the foregoing exemplary embodiments, and an overlapping description will be omitted as appropriate.

Figure 10:
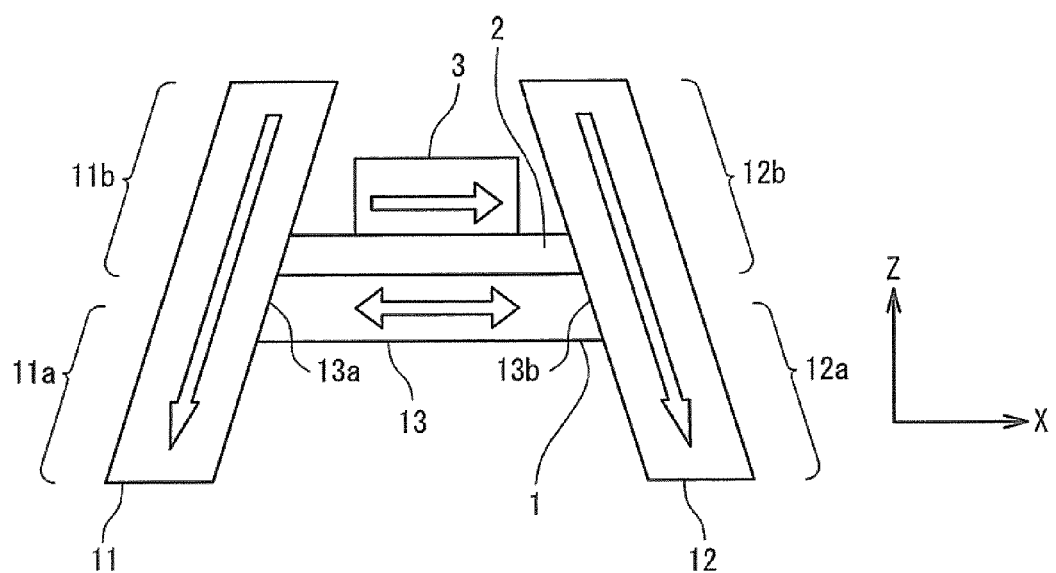
FIG. 10 is a side view schematically showing a structure of a magnetoresistance effect element according to a fifth exemplary embodiment of the present invention.

FIG. 10 is a side view schematically showing a structure of the magnetoresistance effect element according to the fifth exemplary embodiment. In the present exemplary embodiment, the shape of the magnetization free layer 1 is not planar but stereoscopic, and the magnetization fixed regions 11, 12 and the magnetization switching region 13 are not formed in the same plane. For example, in FIG. 10, the magnetization switching region 13 is formed in the XY plane, while the magnetization fixed regions 11 and 12 are formed in a plane close to the YZ plane.

FIG. 10 just shows one example of the XZ plane shape of the magnetization free layer 1. Various modification examples are possible as in the foregoing exemplary embodiments. The magnetization free layer 1 according to the present exemplary embodiment may have the XZ plane shape similar to the XY plane shape of the magnetic free layer 1 shown in FIGS. 2A, 2B, 4A to 4D and 6. Also, the various modification examples shown in FIGS. 5A to 5C can be applied to the magnetization switching region 13.

Also in the above configuration, the fix direction of the magnetization (first fixed magnetization) of the first magnetization fixed region 11 and the fix direction of the magnetization (second fixed magnetization) of the second magnetization fixed region 12 are the same as those in the foregoing exemplary embodiments. That is, the first fixed magnetization is fixed in a direction from the first wide-angle section 11a toward the first narrow-angle section 11b, and the second fixed magnetization is fixed in a direction from the second wide-angle section 12a toward the second narrow-angle section 12b. Alternatively, as shown in FIG. 10, the first fixed magnetization is fixed in a direction from the first narrow-angle section 11b toward the first wide-angle section 11a, and the second fixed magnetization is fixed in a direction from the second narrow-angle section 12b toward the second wide-angle section 12a. In either case, the X-component of the fixed magnetization at the three-way intersection is opposite between the first wide-angle section 11a and the second wide-angle section 12a. Note that the first fixed magnetization and the second fixed magnetization each includes the Z-component, which is different from the foregoing exemplary embodiments.

Figure 11A:
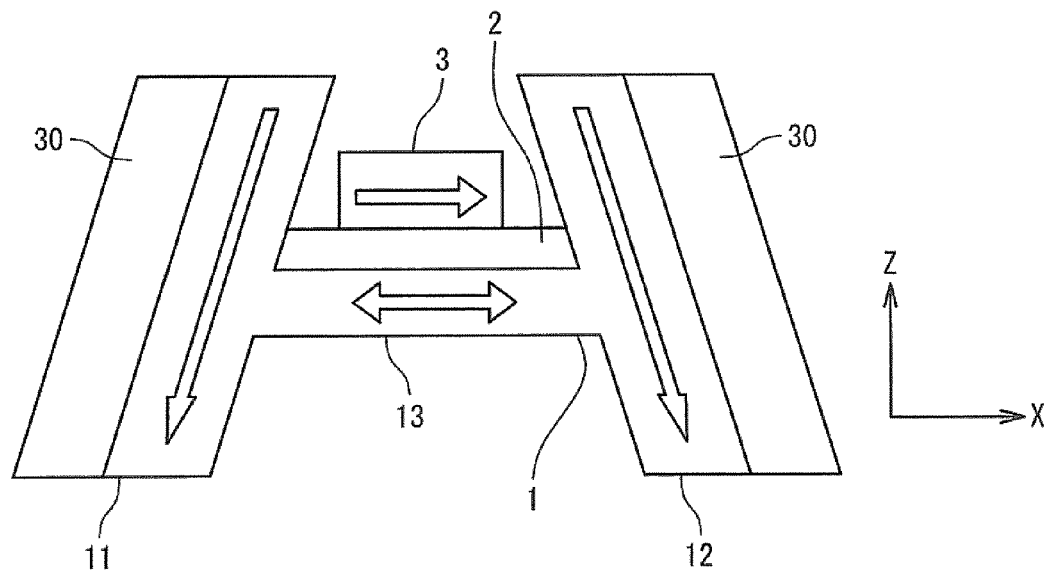
FIG. 11A is a side view showing a modification example of the magnetoresistance effect element according to the fifth exemplary embodiment.
Figure 11B:
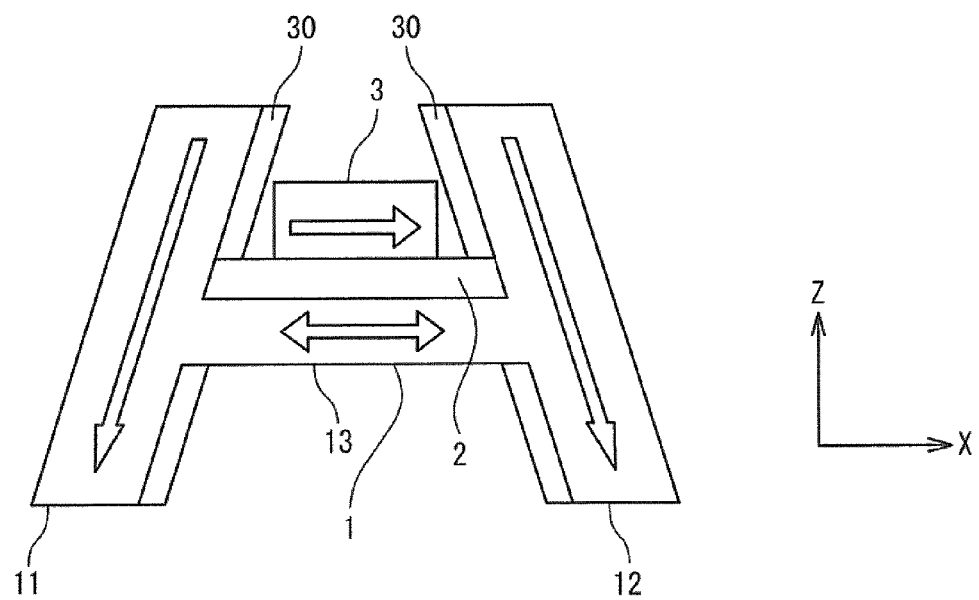
FIG. 11B is a side view showing another modification example of the magnetoresistance effect element according to the fifth exemplary embodiment.

FIGS. 11A and 11B show modification examples of the magnetoresistance effect element according to the present exemplary embodiment. In FIG. 11A, anti-ferromagnetic layers 30 are provided outside of the magnetization fixed regions 11 and 12. In FIG. 11B, anti-ferromagnetic layers 30 are provided inside of the magnetization fixed regions 11 and 12. The anti-ferromagnetic layers 30 are magnetically coupled to the magnetization fixed regions 11 and 12 so as to fix the magnetization directions of the magnetization fixed regions 11 and 12, respectively. It is possible by such a configuration to easily fix the magnetization directions of the magnetization fixed regions 11 and 12.

The same effects as in the case of the first exemplary embodiment can also be obtained by the structure according to the present exemplary embodiment. Furthermore, since the magnetization fixed regions 11 and 12 are vertically arranged, an area of the magnetoresistance effect element can be reduced.

6. Sixth Exemplary Embodiment

In a sixth exemplary embodiment, the same reference numerals are given to the same components as those described in the foregoing exemplary embodiments, and an overlapping description will be omitted as appropriate.

Figure 12:
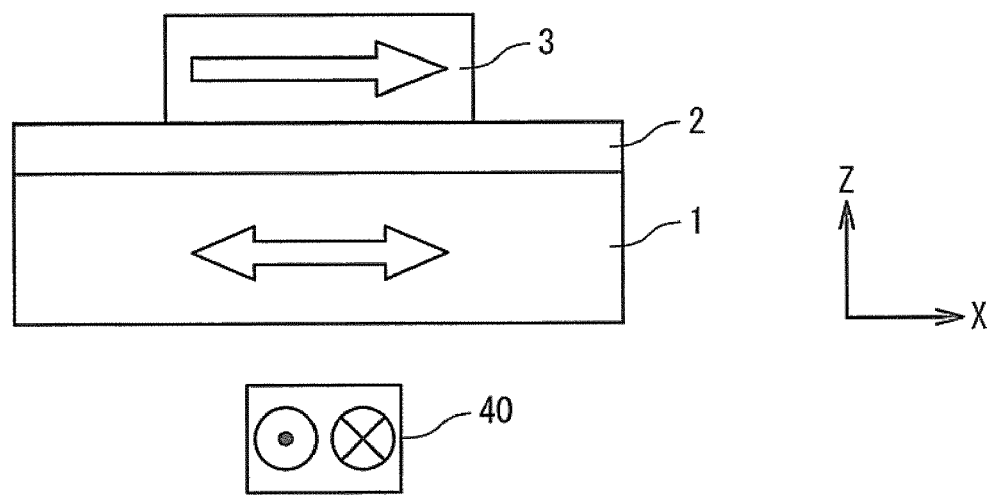
FIG. 12 is a side view schematically showing a structure of a magnetoresistance effect element according to a sixth exemplary embodiment of the present invention.

FIG. 12 is a side view schematically showing a structure of the magnetoresistance effect element according to the sixth exemplary embodiment. According to the present exemplary embodiment, an assist interconnection 40 is provided in the vicinity of the magnetoresistance effect element. At a time of the data writing, a predetermined current flows through the assist interconnection and thereby an assist magnetic field is generated. The assist magnetic field is applied to the magnetization free layer 1 and assists the domain wall motion. That is to say, at a time of the data writing, the current is flowed through the assist interconnection so as to generate the assist magnetic field of a direction assisting the domain wall motion in the magnetization free layer 1.

For example, in FIG. 12, the assist interconnection 40 extending in the Y direction is arranged below the magnetization switching region 13 of the magnetoresistance effect element. When the domain wall is moved toward the +X direction, a current in the +Y direction is flowed through the assist interconnection 40. As a result, the assist magnetic field of the +X direction is applied to the magnetization switching region 13 of the magnetization free layer 1. Due to the assist magnetic field, the magnetization of the magnetization switching region 13 is more likely to be directed to the +X direction. That is, the domain wall motion toward the +X direction is assisted by the assist magnetic field. On the other hand, when the domain wall is moved toward the −X direction, a current in the −Y direction is flowed through the assist interconnection 40. Note that the position and the number of the assist interconnection are not limited to those shown in FIG. 12.

According to the present exemplary embodiment, as described above, the assist magnetic field generated by the assist interconnection 40 is applied to the magnetization switching region 13 concurrently with the supply of the write current to the magnetization free layer 1. Since the domain wall action is assisted by the assist magnetic field, it is possible to reduce the amount of the write current to be supplied to the magnetization free layer 1. That is, the minimum write current required for the domain wall motion is further decreased. This means that the write margin is further enlarged.

Moreover, it is preferable that the assist interconnection 40 shown in FIG. 12 is the interconnection for supplying the write current to the magnetization free layer 1. That is, it is preferable that the interconnection for supplying the write current to the magnetization free layer 1 is concurrently used as the assist interconnection 40. In this case, the assist interconnection 40 is connected to the wide-angle section 11a or 12a of the magnetization free layer 1. At a time of the data writing, the write current is supplied to or drawn from the wide-angle section 11a or 12a through the assist interconnection 40. At the same time, the assist magnetic field generated by the write current is applied to the magnetization switching region 13. By such a configuration, the number of interconnections can be reduced and hence a circuit area can be reduced.

Figure 13A:
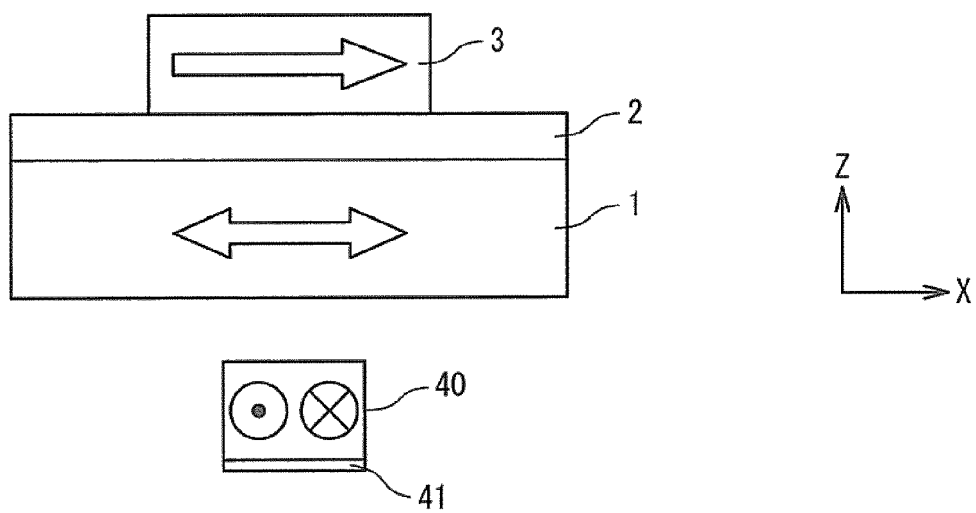
FIG. 13A is a side view showing a modification example of the magnetoresistance effect element according to the sixth exemplary embodiment.
Figure 13B:
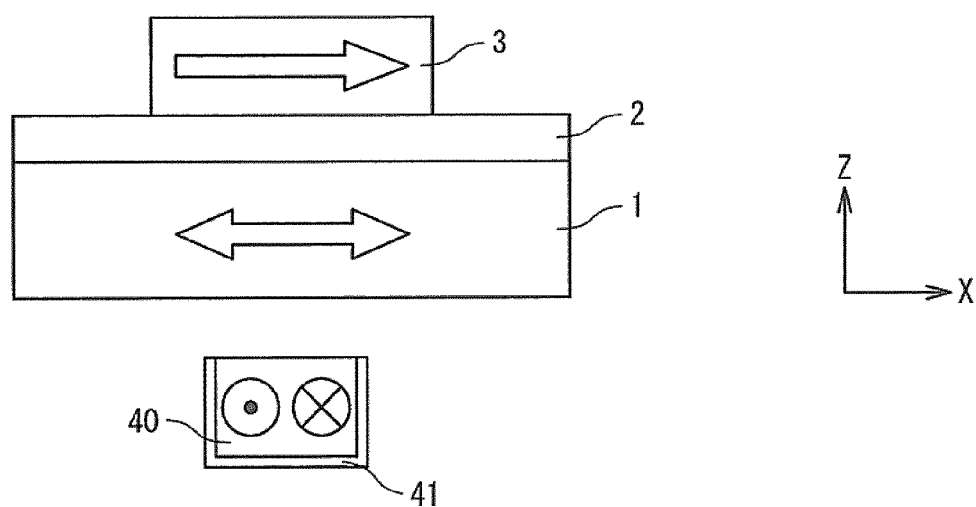
FIG. 13B is a side view showing another modification example of the magnetoresistance effect element according to the sixth exemplary embodiment.

FIGS. 13A and 13B show modification examples of the assist interconnection 40. The assist interconnection 40 shown in FIGS. 13A and 13B has a yoke structure. That is, a part of surfaces of the assist interconnection 40 that do not face to the magnetization switching region 13 is covered by a magnetic material 41. In FIG. 13A, a bottom surface of the assist interconnection 40 is covered by the magnetic material 41. In FIG. 13B, side surfaces and a bottom surface of the assist interconnection 40 are covered by the magnetic material 41. Such a yoke structure causes increase in the assist magnetic field, which enables further reduction in the write current.

7. Circuit Configuration

Figure 14:
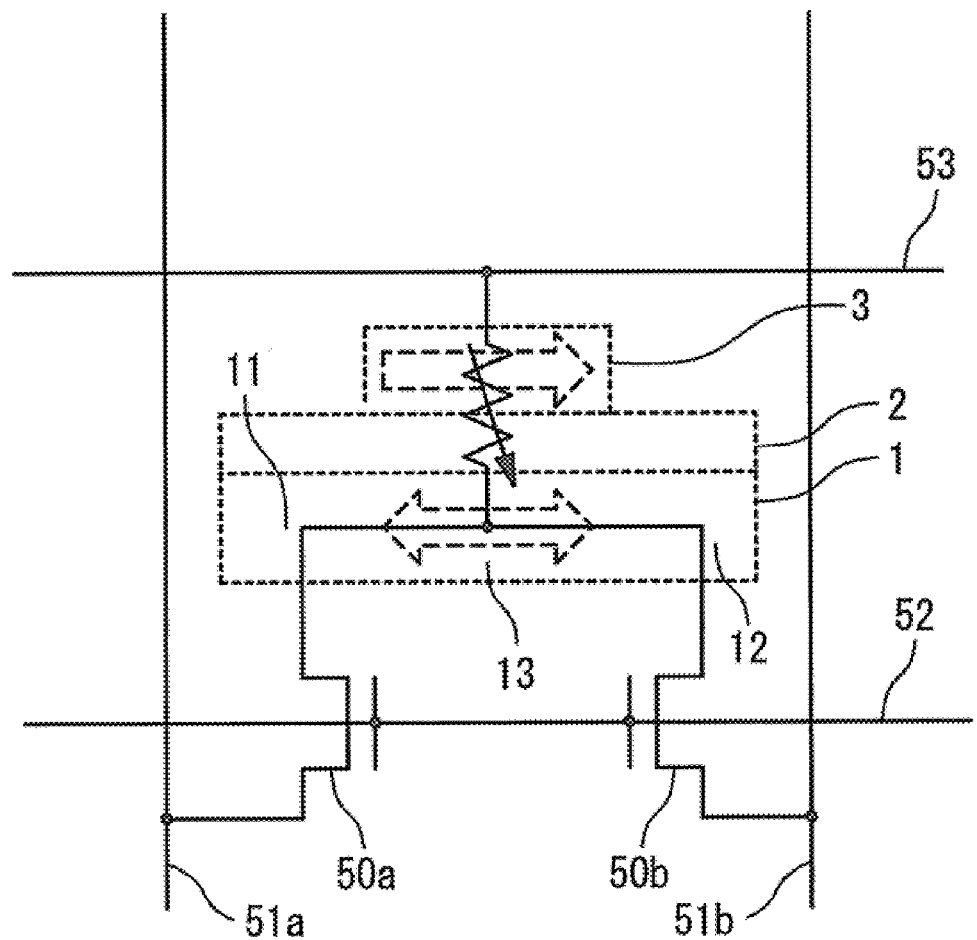
FIG. 14 is a circuit diagram showing an example of a magnetic memory cell according to exemplary embodiments of the present invention.

FIG. 14 is a circuit diagram showing an example of a magnetic memory cell using the above-described magnetoresistance effect element. In FIG. 14, selection transistors 50a and 50b for supplying the write current are connected to the magnetization free layer 1. More specifically, one of a source and a drain of the selection transistor 50a is connected to the first wide-angle section 11a of the first magnetization fixed region 11, and the other is connected to a first bit line 51a. Similarly, one of a source and a drain of the selection transistor 50b is connected to the second wide-angle section 12a of the second magnetization fixed region 12, and the other is connected to a second bit line 51b. Gates of the selection transistors 50a and 50b are connected to a word line 52. Further, the magnetization fixed layer 3 is connected to a ground line 53.

At a time of the data writing, the word line 52 is turned ON, the ground line 53 is turned OFF, and a predetermined potential difference is applied between the bit lines 51a and 51b. As a result, the write current flows in a path of, for example, "the first bit line 51a—the selection transistor 50a—the first wide-angle section 11a of the first magnetization fixed region 11—the magnetization switching region 13—the second wide-angle section 12a of the second magnetization fixed region 12—the selection transistor 50b—the second bit line 51b". The reversed current path is also possible. Consequently, the data writing described in the foregoing exemplary embodiments can be achieved.

At a time of the data reading, the word line 52 is turned ON, the ground line 53 is turned ON, and the bit lines 51a and 51b are set to the same potential. As a result, a read current flows in a path of "the bit lines 51a and 51b—the selection transistors 50a and 50b—the magnetization free layer 1—the tunnel barrier layer 2—the magnetization fixed layer 3—the ground line 53". The stored data can be sensed based on the read current.

Figure 15:
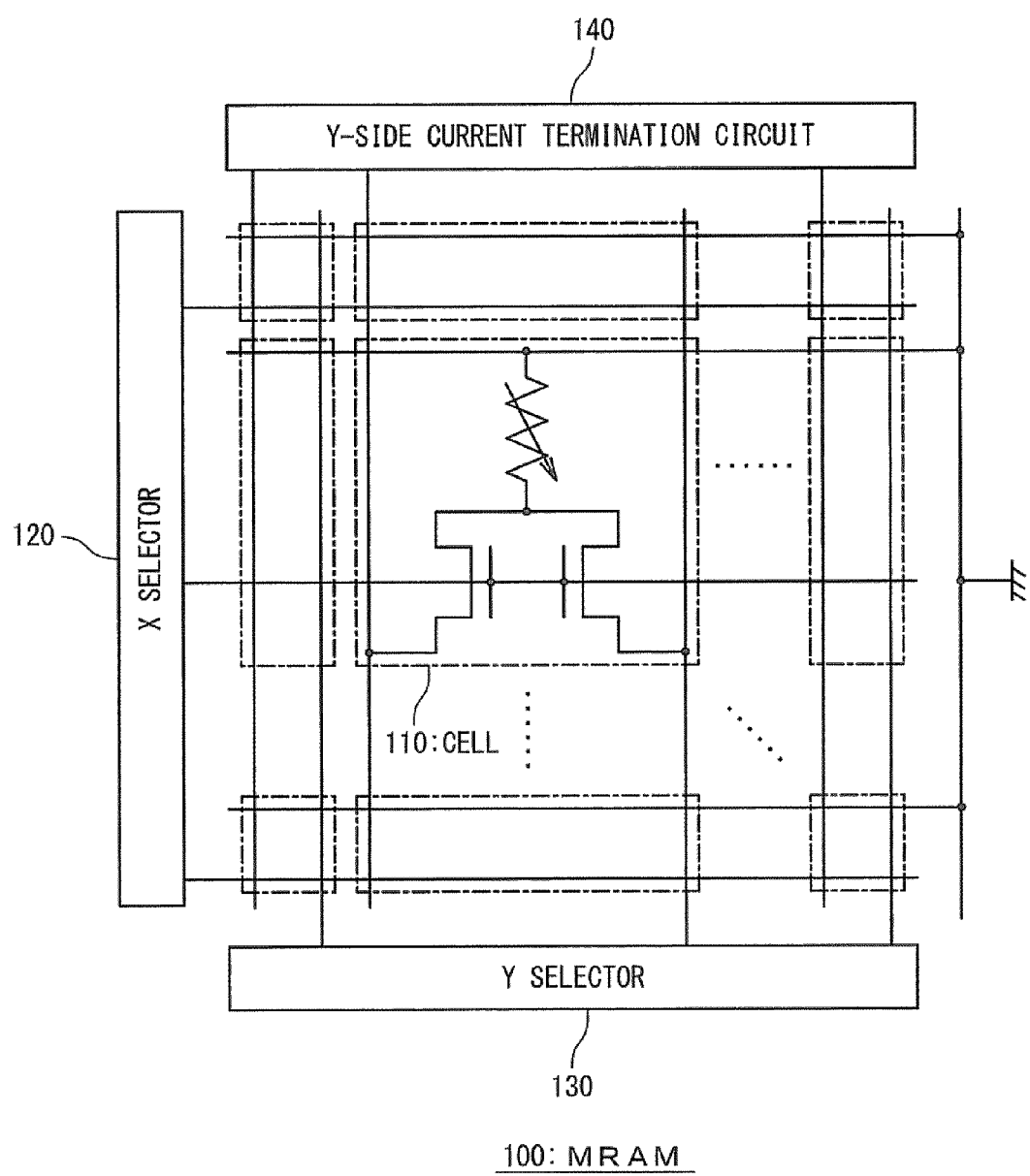
FIG. 15 is a circuit diagram schematically showing a configuration of a MRAM according to exemplary embodiments of the present invention.

FIG. 15 shows an example of a configuration of a MRAM 100 in which a plurality of magnetic memory cells 110 are arranged in an array form. Each of the magnetic memory cells 110 has the configuration shown in FIG. 14. The word lines 52 are connected to an X selector 120, and the X selector 120 selects a word line 52 connected to a magnetic memory cell 110 to be accessed. The bit lines 51a and 51b are connected to a Y selector 130 and a Y side current termination circuit 140. The Y selector 130 selects a bit line 51a (or 51b) connected to the magnetic memory cell 110 to be accessed. Through the selected bit line, the write current is supplied to or drawn from the magnetic memory cell 110 to be accessed.

The exemplary embodiment of the present invention has been described above with reference to the attached drawings. However, the present invention is not limited to the above-described exemplary embodiment and can be appropriately modified by a person skilled in the art without departing from the scope of the invention.

The invention claimed is:

1. A magnetoresistance effect element comprising:
a magnetization free layer connected to a selection transistor; and
a magnetization fixed layer connected to said magnetization free layer through a nonmagnetic layer and whose magnetization direction is fixed,
wherein said magnetization free layer includes:
a magnetization switching region having reversible magnetization and overlapping with said magnetization fixed layer;
a first magnetization fixed region having first fixed magnetization and connected to one end in a direction of a easy magnetization axis of said magnetization switching region; and
a second magnetization fixed region having second fixed magnetization and connected to the other end in a direction of the easy magnetization axis of said magnetization switching region,
wherein said first magnetization fixed region and said magnetization switching region form a three-way intersection, and said second magnetization fixed region and said magnetization switching region form another three-way intersection.

2. The magnetoresistance effect element according to claim 1,
wherein said first magnetization fixed region comprises:
a first wide-angle section forming an angle of 90 degrees or more with said easy magnetization axis; and
a first narrow-angle section forming an angle of 90 degrees or less with said easy magnetization axis, and
wherein said second magnetization fixed region comprises:
a second wide-angle section forming an angle of 90 degrees or more with said easy magnetization axis; and
a second narrow-angle section forming an angle of 90 degrees or less with said easy magnetization axis.

3. The magnetoresistance effect element according to claim 2,
wherein said first wide-angle section is connected to a first selection transistor, and said second wide-angle section is connected to a second selection transistor.

4. The magnetoresistance effect element according to claim 2,
wherein said first fixed magnetization is fixed in a direction from said first wide-angle section toward said first narrow-angle section, and said second fixed magnetization is fixed in a direction from said second wide-angle section toward said second narrow-angle section.

5. The magnetoresistance effect element according to claim 2,
wherein said first fixed magnetization is fixed in a direction from said first narrow-angle section toward said first wide-angle section, and said second fixed magnetization is fixed in a direction from said second narrow-angle section toward said second wide-angle section.

6. The magnetoresistance effect element according to claim 4,
wherein said first magnetization fixed region and said second magnetization fixed region are mirror symmetric to each other with respect to said magnetization switching region.

7. The magnetoresistance effect element according to claim 4,
wherein said first magnetization fixed region and said second magnetization fixed region are rotationally symmetric to each other around said magnetization switching region.

8. The magnetoresistance effect element according to claim 2,
wherein at a time of data writing, a write current is flowed from said first wide-angle section to said second wide-angle section through said magnetization switching region in said magnetization free layer.

9. The magnetoresistance effect element according to claim 1,
wherein a direction in which said magnetization switching region, said nonmagnetic layer and said magnetization fixed layer are stacked is a first direction, wherein said magnetization switching region, said first magnetization fixed region and said second magnetization fixed region are formed in a same plane perpendicular to said first direction.

10. The magnetoresistance effect element according to claim 1,
wherein a direction in which said magnetization switching region, said nonmagnetic layer and said magnetization fixed layer are stacked is a first direction,
wherein said magnetization switching region is formed in a first plane perpendicular to said first direction, and said first magnetization fixed region and said second magnetization fixed region are respectively formed in planes different from said first plane.

11. The magnetoresistance effect element according to claim 1, further comprising:
a first ferromagnet magnetically coupled to said first magnetization fixed region so as to fix a direction of said first fixed magnetization; and
a second ferromagnet magnetically coupled to said second magnetization fixed region so as to fix a direction of said second fixed magnetization.

12. The magnetoresistance effect element according to claim 1,
wherein said magnetization switching region includes:
a first region located on a side of said one end with respect to an intermediate portion between said one end and said other end and having a different cross-sectional area from that at said intermediate portion; and
a second region located on a side of said other end with respect to said intermediate portion and having a different cross-sectional area from that at said intermediate portion.

13. The magnetoresistance effect element according to claim 1,
wherein said magnetization free layer comprises a plurality of ferromagnetic layers magnetically coupled to each other, and at least one of said plurality of ferromagnetic layers comprises said magnetization switching region, said first magnetization fixed region and said second magnetization fixed region.

14. A MRAM comprising a plurality of magnetic memory cells arranged in an array form,
wherein each of said plurality of magnetic memory cells comprises:
the magnetoresistance effect element according to claim 1; and
a transistor for supplying a write current to said magnetization free layer at a time of data writing.

15. The MRAM according to claim 14,
wherein at a time of said data writing, an external magnetic field is applied to said magnetization switching region concurrently with the supply of said write current.

16. The MRAM according to claim 15, further comprising an interconnection for supplying said write current to said magnetization free layer,
wherein at a time of said data writing, said external magnetic field is concurrently generated by said write current flowing through said interconnection.

17. The magnetoresistance effect element according to claim 3,
wherein said first fixed magnetization is fixed in a direction from said first wide-angle section toward said first narrow-angle section, and said second fixed magnetization is fixed in a direction from said second wide-angle section toward said second narrow-angle section.

18. The magnetoresistance effect element according to claim 3,
wherein said first fixed magnetization is fixed in a direction from said first narrow-angle section toward said first wide-angle section, and said second fixed magnetization is fixed in a direction from said second narrow-angle section toward said second wide-angle section.

19. The magnetoresistance effect element according to claim 5,
wherein said first magnetization fixed region and said second magnetization fixed region are mirror symmetric to each other with respect to said magnetization. switching region.

20. The magnetoresistance effect element according to claim 5,
wherein said first magnetization fixed region and said second magnetization fixed region are rotationally symmetric to each other around said magnetization switching region.

* * * * *